(12) United States Patent
Yamamoto

(10) Patent No.: US 7,080,675 B2
(45) Date of Patent: Jul. 25, 2006

(54) METHOD AND APPARATUS FOR JOINING ADHESIVE TAPE TO BACK FACE OF SEMICONDUCTOR WAFER

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/968,131

(22) Filed: Oct. 20, 2004

(65) Prior Publication Data

US 2005/0101103 A1    May 12, 2005

(30) Foreign Application Priority Data

Nov. 12, 2003    (JP)    ............... 2003-381938

(51) Int. Cl.
*H01L 21/68* (2006.01)
*H01L 21/301* (2006.01)
*H01L 21/44* (2006.01)
*B32B 39/00* (2006.01)

(52) U.S. Cl. ............ 156/538; 156/556; 156/558; 438/464; 438/976

(58) Field of Classification Search ............ 156/391, 156/538, 539, 556, 557, 558, 584, 580; 438/464, 438/976

See application file for complete search history.

(56) References Cited

U.S. PATENT DOCUMENTS

| | | | | | |
|---|---|---|---|---|---|
| 5,888,883 | A | * | 3/1999 | Sasaki et al. | ............ 438/460 |
| 6,007,920 | A | * | 12/1999 | Umehara et al. | ......... 428/473.5 |
| 6,129,811 | A | * | 10/2000 | McKenna et al. | ............ 156/391 |
| 6,235,144 | B1 | * | 5/2001 | Yamamoto et al. | ......... 156/344 |
| 6,297,131 | B1 | * | 10/2001 | Yamada et al. | ............ 438/464 |
| 2003/0133762 | A1 | * | 7/2003 | Yamamoto et al. | ......... 406/198 |

FOREIGN PATENT DOCUMENTS

| | | | |
|---|---|---|---|
| JP | 62174940 A | * | 7/1987 |
| JP | 10-189693 A1 | | 7/1998 |
| JP | 2001284434 A | * | 10/2001 |
| WO | WO 2002102625 A1 | * | 12/2002 |

\* cited by examiner

*Primary Examiner*—Sue A. Purvis

(74) *Attorney, Agent, or Firm*—Rader, Fishman & Grauer PLLC

(57) ABSTRACT

In a method for joining an adhesive tape to a back face of a semiconductor wafer after a process of working the back face of the semiconductor wafer, the semiconductor wafer is held at a state where a face having a pattern formed thereon is directed upward, and the adhesive tape is joined to the back face of the semiconductor wafer from below.

4 Claims, 4 Drawing Sheets

METHOD AND APPARATUS FOR JOINING ADHESIVE TAPE TO BACK FACE OF SEMICONDUCTOR WAFER

BACKGROUND OF THE INVENTION (1) Field of the Invention

The present invention relates to a method and an apparatus for joining an adhesive tape to a back face of a semiconductor wafer after working the back face of the semiconductor wafer.

(2) Description of the Related Art

Generally, a surface protective tape is preliminarily joined to a surface of a semiconductor wafer (hereinafter, simply referred to as a wafer) which has been subjected to a pattern forming process, and part of the surface protective tape, which protrudes from an outer circumference of the wafer is cut out along an outer peripheral edge of the wafer. The wafer whose whole surface is protected with the surface protective tape is turned upside down, a process of polishing a back face of the wafer is performed on the back face of the wafer, which faces upward, and the wafer is turned back by a wafer transport unit and housed into a wafer cassette with the wafer pattern surface directed upward. After that, the wafer to which the wafer back face polishing process has been completed is integrated with a ring frame by joining an adhesive tape for dicing to the back face of the wafer for a so-called dicing process of dicing the wafer into chips. The posture of the wafer when the adhesive tape for dicing is joined to the back face of the wafer is that, typically, the back face of the wafer is directed upward (see, for example, JP-A 10-189693 (1998)). At the time of wafer mounting of integrating a wafer and a ring frame, the wafer housed in the wafer cassette is turned upside down.

In JP-A 10-189693 (1998), a wafer is turned upside down on the outside of the adhesive tape joining apparatus and mounted with the wafer back face directed upward on a wafer holding table. An adhesive tape is joined to the wafer, and the wafer and the ring frame are integrated with each other. In short, the back face of the wafer is directed upward and the adhesive tape is joined to the back face from above, thereby integrating the wafer and the ring frame.

Those works are done in a clean room and it is necessary to effectively use the limited space of the clean room. Consequently, for example, in order to automate mounting of a wafer onto a wafer holding member, joining of an adhesive tape, and the like, a wafer turning mechanism has to be mounted on the apparatus disclosed in JP-A 10-189693 (1998). When the wafer turning mechanism or the like is added as an additional function, the size of the apparatus accordingly increases and it becomes difficult to effectively use the limited space of the clean room.

The rigidity of a wafer subjected to back face grinding decreases and, due to the influence of the pattern surface, a warp occurs. Due to the warp, holding of the wafer at the time of transport becomes unstable and problems such that the wafer drops during a wafer turning work and the wafer cannot be transported and held with high precision occur.

SUMMARY OF THE INVENTION

The present invention is made in view of the above circumstances and its object is to provide a method and an apparatus capable of joining an adhesive tape to a back face of a wafer from below without turning the wafer upside down so that the adhesive tape can be safely and reliably joined to the back face of the wafer on which a process of working the back face of the wafer has been completed while effectively using the limited space of a clean room or the like.

In order to achieve the above object, the present invention employs the following configuration:

A method for joining an adhesive tape to a back face of a semiconductor wafer after a process of working the back face of the semiconductor wafer, the method comprising the step of:

holding the semiconductor wafer in a state where a face having a pattern formed thereon is directed upward, and joining the adhesive tape to the back face of the semiconductor wafer from below.

According to the method of the present invention, an adhesive tape is joined to a back face of a wafer from below, so that it is unnecessary to turn the wafer upside down and the adhesive tape can be joined without changing the posture of the wafer. Consequently, even in the case of using an apparatus capable of automating a series of processes from joining of an adhesive tape for dicing to separation of a protective tape from the surface of the wafer, it is unnecessary to mount a wafer turning mechanism. Therefore, the size of the apparatus does not increase and the limited space of the clean room can be effectively used.

In the method according to the present invention, the adhesive tape is joined to a ring frame in advance, and the semiconductor wafer is joined to the adhesive tape.

According to this method, since the adhesive tape is joined to the ring frame in advance, the wafer and the ring frame can be integrated with reliability.

In the method according to the present invention, either the ring frame or the semiconductor wafer faces the other in an inclined posture, and the adhesive tape is gradually joined from an end of the semiconductor wafer.

Herein, the ring frame is disposed below the semiconductor wafer, and the adhesive tape may be gradually joined from the end of the semiconductor wafer while moving the ring frame upward. Further, in a step of moving the ring frame upward, a joining roller may roll on a non-adhesion face of the adhesive tape while pressing the non-adhesion face.

According to this method, the adhesive tape is gradually joined from the end of the wafer, so that the adhesive tape can be prevented from being joined to the wafer in a haphazard way. At the time of joining the adhesive tape, capture of air between the adhesive tape and the wafer can be suppressed. The adhesive tape can be joined without leaving air bubbles between the adhesive tape and the wafer.

In order to achieve the above object, the present invention also employs the following configuration:

An apparatus for joining an adhesive tape to a back face of a semiconductor wafer after a process of working the back face of the semiconductor wafer, the apparatus comprising:

a holding member for holding the semiconductor wafer;

an arm for holding the semiconductor wafer held by the holding member so as to face a ring frame on which an adhesive tape is joined in advance; and a joining mechanism for joining the adhesive tape joined to the ring frame from below the semiconductor wafer, wherein the holding member is provided with a mechanism for preventing the semiconductor wafer from dropping.

The apparatus according to the present invention can perform a series of processes of joining an adhesive tape to a back face of a wafer so as to be subjected to a dicing process and integrating the wafer with a ring frame by itself after the process of working the back face of the wafer. Since it is unnecessary to turn the wafer upside down, increase in size of the apparatus itself is suppressed and the limited space of a clean room or the like can be effectively used.

In the apparatus according to the present invention, preferably, the drop preventing mechanism has an independent driving system.

Specifically, when the drop preventing mechanism has an independent driving system, for example, even in the case where some trouble occurs in the other mechanism of the apparatus, the wafer can be held without being dropped.

Preferably, the joining mechanism is a ring frame lifting mechanism for moving upward/downward the arm which holds the ring frame. More preferably, the joining mechanism further includes a joining roller which rolls while pressing a non-adhesion face of the adhesive tape joined to the ring frame.

With this configuration, joining of an adhesive tape to a back face of a wafer and integration with a ring frame as a subsequent process can be performed by a single apparatus without turning the wafer upside down after the process of working the back face, so that increase in size of the apparatus can be suppressed. Consequently, the clean room can be effectively used.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of the present invention will be described below with reference to the drawings.

Figure 1:
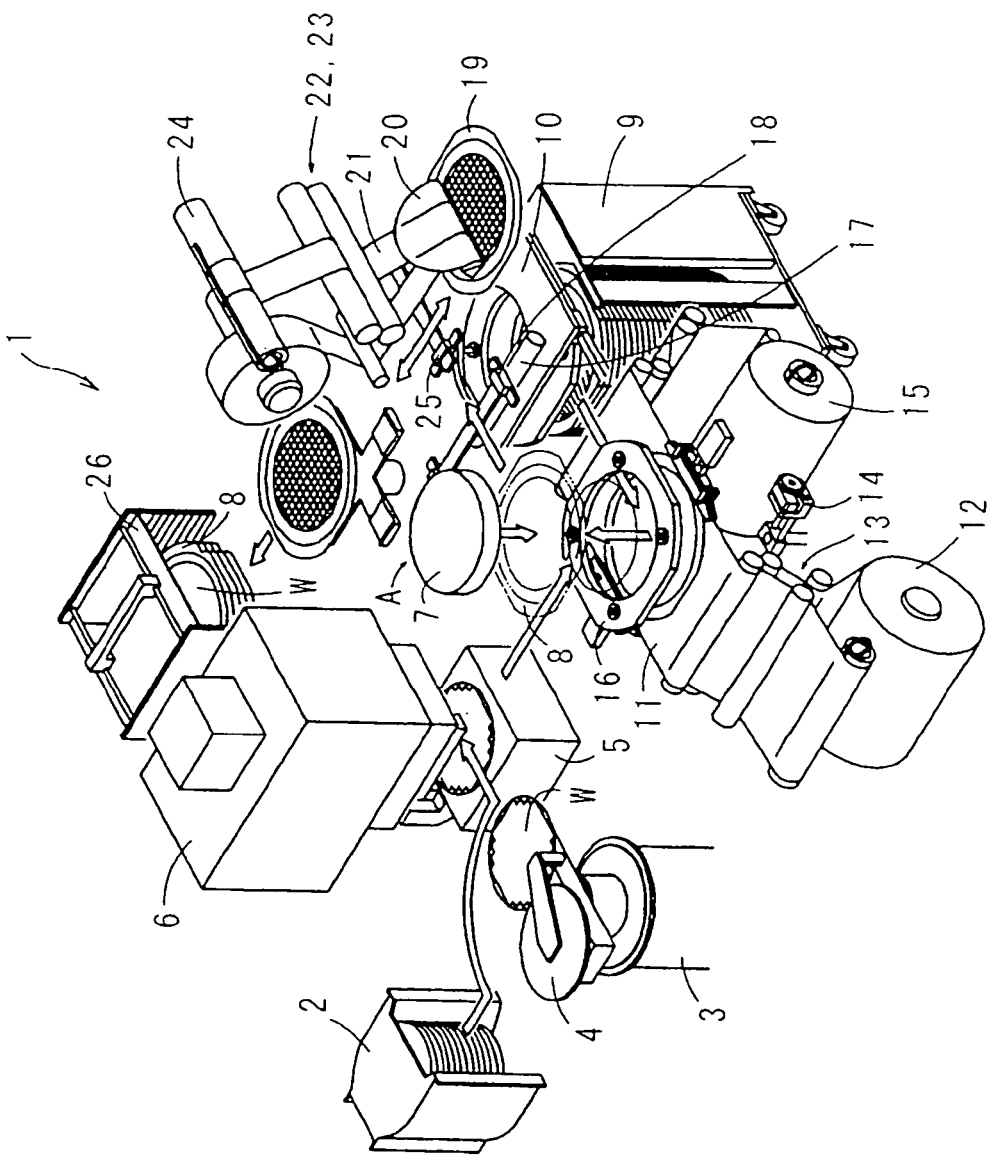
FIG. 1 is a schematic perspective view showing a main part of an apparatus for joining an adhesive tape to a back face of a semiconductor wafer according to the present invention.

FIG. 1 is a schematic perspective view showing a main part of an adhesive tape joining apparatus according to the embodiment of the present invention.

As shown in FIG. 1, an adhesive tape joining apparatus 1 according to this embodiment comprises: a wafer supply unit 2 in which a cassette housing a stack of plural semiconductor wafers (hereinafter, simply referred to as wafers) W which have been subjected to a back face working process is loaded; a wafer transport mechanism 3 having a bendable and swingable robot arm; a wafer pressing mechanism 4 for correcting a warped wafer W to be flat; an alignment stage 5 for aligning the wafer W; an ultraviolet ray irradiating unit 6 for irradiating a surface protective tape with an ultraviolet ray; a wafer chuck table 7 as a holding member for suction-holding the wafer W; a ring frame supply unit 9 in which ring frames 8 are loaded; a ring frame transport mechanism 10 for transferring the ring frame 8; a dicing adhesive tape supply unit 12 for supplying an adhesive tape 11 for dicing; a dicing adhesive tape joining unit 13 for joining the adhesive tape 11 for dicing; a dicing adhesive tape cutting unit 14 for cutting the adhesive tape 11 for dicing; a dicing adhesive tape collecting unit 15 for collecting a cut-out unnecessary dicing adhesive tape; a ring frame lifting mechanism 16 for moving upward/downward the ring frame 8 to which the adhesive tape 11 for dicing is joined; a wafer mounting mechanism 17 for joining the wafer W to the adhesive tape 11 for dicing joined to the ring frame 8; a ring frame transport mechanism 18 for transferring a ring frame used for wafer mounting; a separation table 19 for suction-holding the ring frame as a component of a releasing apparatus; an adhesive tape joining unit 22 for joining a separation tape 21 to the wafer W integrated with the ring frame 8 by wafer mounting on the separation table 19; a separation tape separating unit 23 for separating the joined separation tape 21 together with a surface protective tape 20; a tape collecting unit 24 for winding up the separated separation tape; a ring frame housing mechanism 25 for housing the ring frame; and a ring frame collecting unit 26 in which the cassette for housing the stack of used ring frames. The wafer chuck table 7 is provided with a drop preventing mechanism A for preventing the held wafer W from being dropped.

The wafer supply unit 2 inserts and houses the wafers W in a horizontal posture with their surfaces on which the protective tape 20 is joined directed upward and stacked in the vertical direction at proper intervals into a cassette. The cassette is loaded onto a cassette stand. In the ring frame collecting unit 26, similarly, the ring frames 8 on which the wafers W subjected to the protective tape separating process are mounted are inserted and housed in a ring frame cassette while maintaining proper intervals in the vertical direction, and the ring frame cassette is loaded onto the cassette stand.

The robot arm of the wafer transport mechanism 3 is movable in the horizontal direction and swingable, unloads the wafer W from the wafer supply unit 2 and supplies the wafer W onto the alignment stage 5.

The wafer pressing mechanism 4 presses the wafer W from the surface side in the case where the wafer W supplied onto the alignment stage 5 cannot be suction-held by vacuum due to a warp. The pressed wafer W is corrected to be flat and is suction-held on the alignment stage 5.

The alignment stage 5 aligns the wafer W on the basis of detection of orientation flatness, a notch and the like of the wafer W. In the case where the surface protective tape 20 joined to the surface of the wafer W is an ultraviolet-curing adhesive tape, ultraviolet rays are emitted from an ultraviolet ray irradiating unit disposed above the alignment stage 5. By ultraviolet irradiation, the joining of the surface protective tape 20 decreases, so that separation of the surface protective tape 20 which will be described later can be easily performed.

After that, the wafer W corrected to be flat is transferred as it is from the alignment stage 5 to the wafer chuck table 7 as a holding member.

Figure 2:
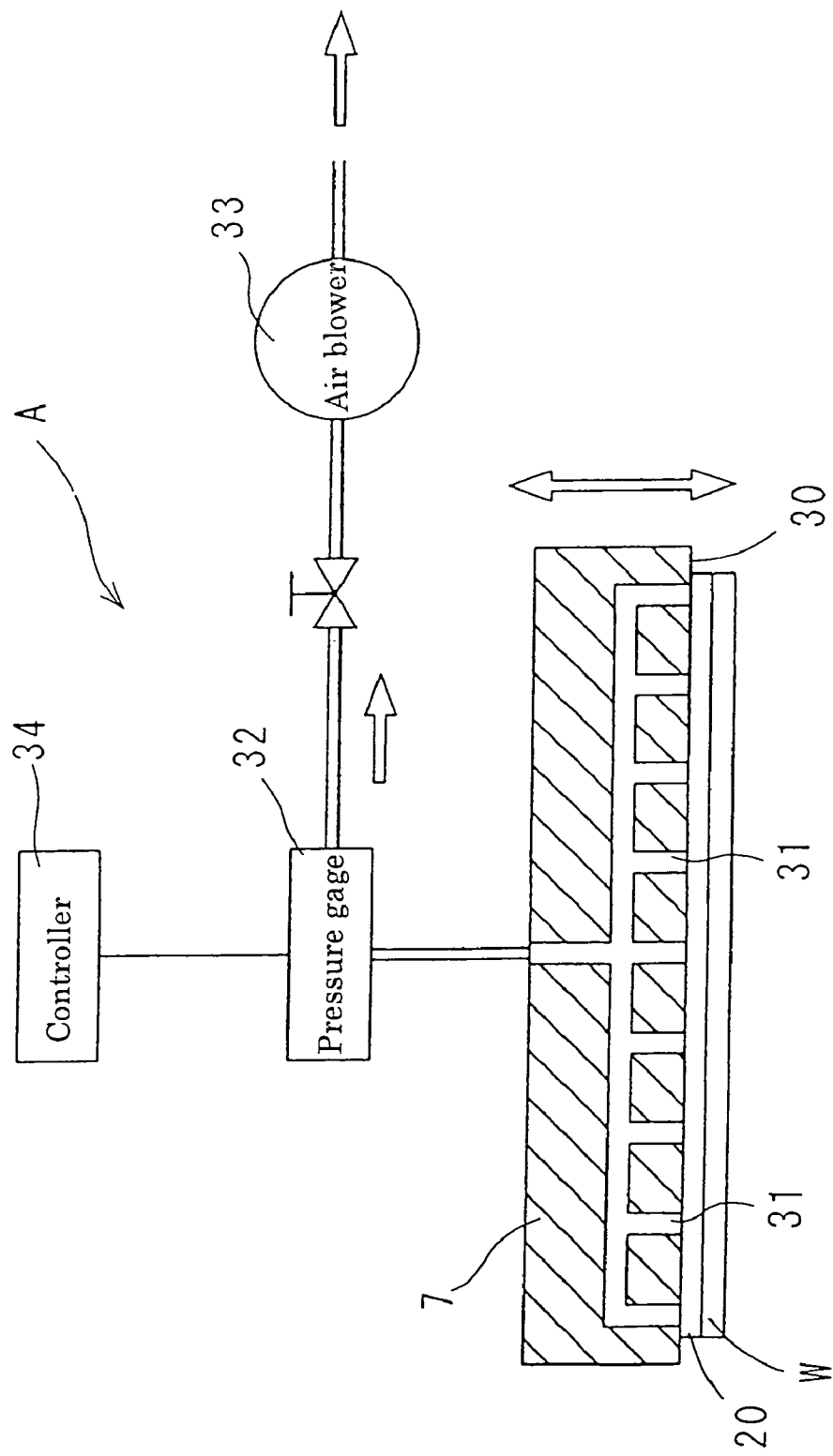
FIG. 2 is a schematic diagram showing an example of a drop preventing mechanism of the apparatus according to the present invention.

In the wafer chuck table 7, as shown in FIG. 2, a plurality of holes 31 are formed in a suction surface 30 for sucking the wafer W on which the surface protective tape 20 is joined. The holes 31 are communicated with each other and connected to an air blower 33 via a pressure gauge 32. The air blower 33 or the like suction-holds the wafer W by on/off control of a controller 34 connected to the pressure gage 32 so that the wafer W does not drop. The drop preventing mechanism A is constructed by the air blower 33 communicated with the wafer chuck table 7, the controller 34, the pressure gauge 32, and the like. As the drop preventing mechanism A for holding the wafer W so as not to drop, a Bernoulli's chuck for holding the wafer W by generating negative pressure between the suction surface 30 and the wafer W by ejector effect can be also used. The drop preventing mechanism A has an electric system independent of the other driving systems of the apparatus. Consequently, for example, even in the case where some trouble such as blackout occurs in the electric system on the apparatus side, the controller 34, the air blower 33 and the like operate without being influenced by the blackout and the wafer W does not drop even at the time of emergency. As described above, also in the case where the wafer W is sucked and transported in a state where the lower part of the wafer W is free, drop of the wafer W can be prevented by the drop preventing mechanism A.

Referring again to FIG. 1, the ring frame supply unit 9 houses the ring frame 8 positioned in a predetermined direction into a wagon in a stacked manner. The ring frame transport mechanism 18 suction-holds the ring frame 8 by vacuum and transfers it.

The dicing adhesive tape supply unit 12 leads the adhesive tape 11 for dicing from an original roll so as to pass below the ring frame 8 to the dicing adhesive tape joining unit 13 and the dicing adhesive tape collecting unit 15. The adhesive tape 11 for dicing which is wider than the diameter of the ring frame 8 is used.

The dicing adhesive tape joining unit 13 joins the adhesive tape 11 for dicing to the ring frame 8, and the dicing adhesive tape cutting unit 14 cuts the adhesive tape 11 for dicing on the ring frame 8. The dicing adhesive tape collecting unit 15 collects the cut-out unnecessary adhesive tape 11 for dicing.

Figure 3:
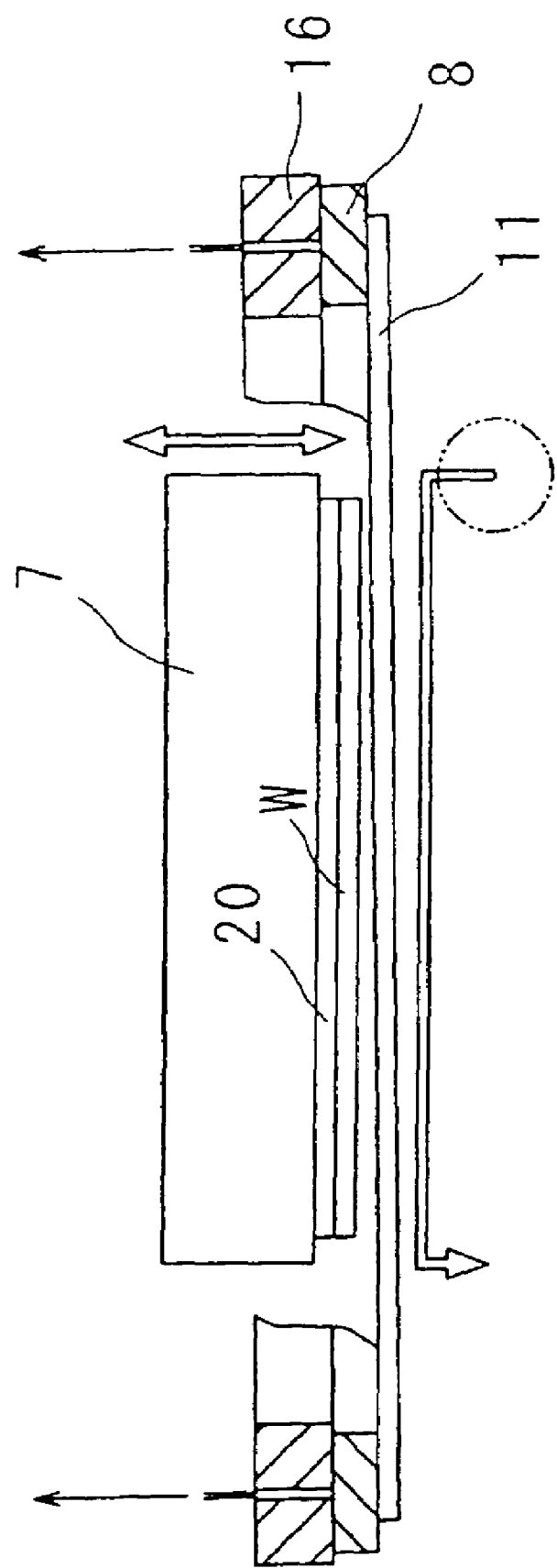
FIG. 3 is a diagram illustrating a method for joining an adhesive tape for dicing to a back face of a wafer.

The ring frame lifting mechanism 16 as a component of a joining mechanism for joining the adhesive tape 11 for dicing joined to the ring frame 8 to the wafer W moves the ring frame 8 to which the adhesive tape 11 for dicing is joined in the vertical direction. The ring frame lifting mechanism 16 performs wafer mounting for moving upward the ring frame 8 to which the adhesive tape 11 for dicing is joined from below the back face of the wafer W to join the wafer W and the adhesive tape 11 for dicing joined to the ring frame 8 each other, thereby integrating the wafer W and the ring frame 8. At this time, as shown in FIG. 3, the ring frame 8 is disposed facing the wafer W in a state where its left side is slightly inclined downward relative to the wafer W. Consequently, by moving upward the ring frame 8 to the wafer W side, that is, from below the wafer W by the ring frame lifting mechanism 16, the adhesive tape 11 for dicing joined to the ring frame 8 is gradually joined from an end of the wafer W. Therefore, as the ring frame lifting mechanism 16 moves upward, the adhesive tape 11 for dicing is joined to the wafer W so as to push air bubbles away, so that the adhesive tape 11 for dicing and the wafer W can be integrated without leaving air bubbles therebetween.

The ring frame transport mechanism 18 suction-holds by vacuum and transfers the ring frame 8 integrated with the wafer W joined to the adhesive tape 11 for dicing.

The separation table 19 mounts and holds thereon the ring frame 8 to which the adhesive tape 11 for dicing is joined, as shown in FIG. 1, suction-holds by vacuum the ring frame 8 as shown in FIG. 1, and joins the separation tape 21 to the surface protective tape 20 on the wafer W by the separation tape joining unit 22. The tape separating unit 22 integrally separates the joined separation tape 21 and the surface protective tape 20. The tape collecting unit 24 collects the separated separation tape 21. At the time of separating the surface protective tape 20, it is also possible to warm the ring frame 8 by a heater or the like (not shown) provided in the separation table 19 to facilitate separation of the surface protective tape 20.

The ring frame housing mechanism 25 suction-holds by vacuum and transfers the ring frame 8 to prepare for housing to the ring frame collecting unit 26.

Figure 4:
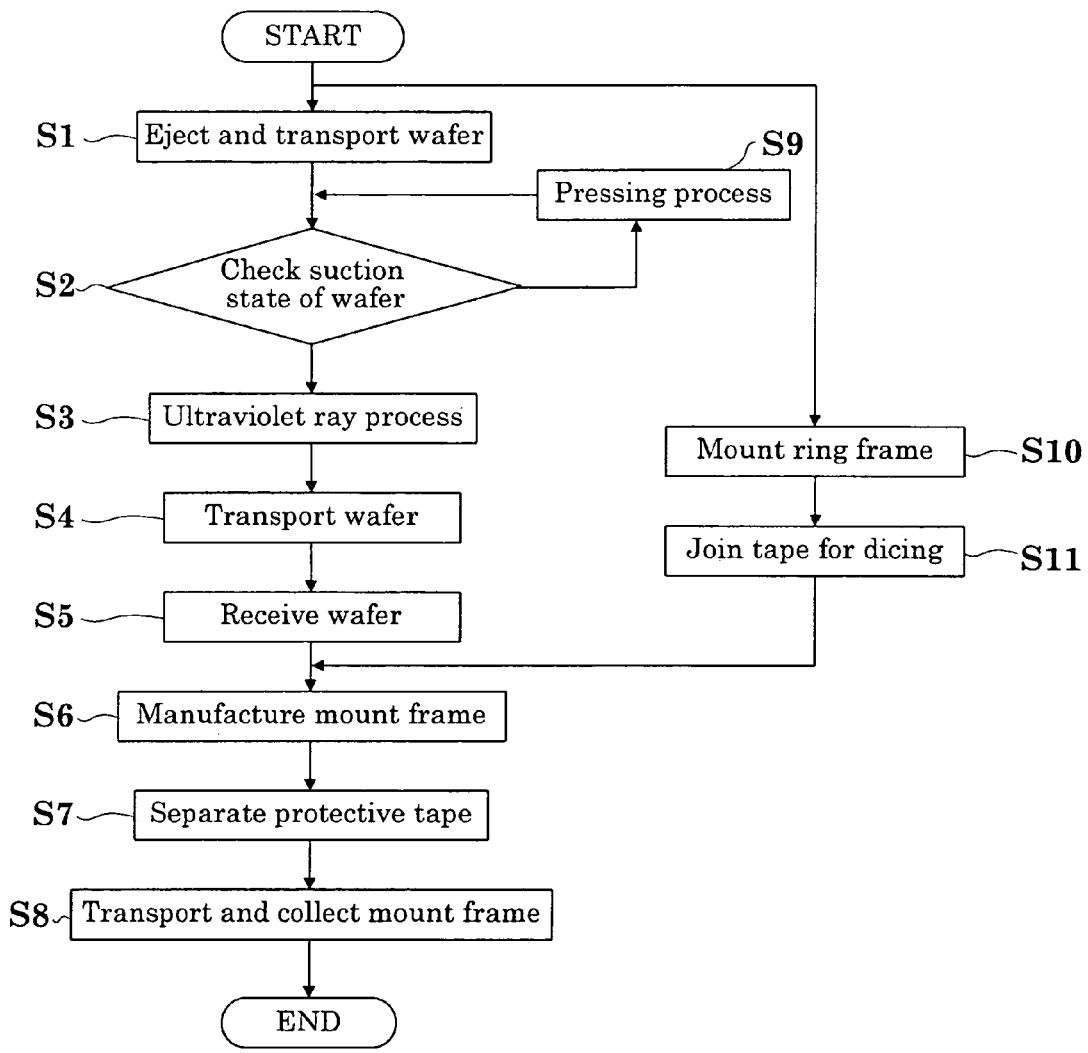
FIG. 4 is a flowchart for describing a method for joining an adhesive tape to a back face of a semiconductor wafer according to the present invention.

Next, a basic process of the adhesive tape joining method according to an embodiment of the present invention with the configuration will be described with reference to FIG. 4.

First, the robot arm of the wafer transport mechanism 3 suction-holds the housed wafer W with its surface on which a pattern is formed directed upward from the cassette of the wafer supply unit 2 and transfers it onto the alignment stage 5 (step S1). The sucked state of the wafer W is checked (step S2). When the flatness of the wafer W is poor and the sucked state is bad due to a warp or the like, the wafer W is corrected to be flat by the wafer pressing mechanism 4 (step S9). The wafer W is suction-held in the corrected state. On the basis of detection of orientation flatness, a notch and the like of the wafer W, the wafer W is aligned. After that, in the case where the surface protective tape 20 joined to the wafer W is of the ultraviolet curing type, ultraviolet ray irradiating process is performed on the alignment stage 5 (step S3).

The alignment stage 5 moves below the wafer chuck table 7 and transfers the aligned wafer W onto the wafer chuck table 7 while holding the flat state (steps S4 and S5).

On the other hand, the stacked ring frames 8 are suction-held one by one from the top of the ring frame supply unit 9 and transferred to the joining position of the adhesive tape 11 for dicing (step S10).

The adhesive tape 11 for dicing is joined and, after that, cut on the ring frame 8. The cut-out unnecessary adhesive tape 11 for dicing is wound up and the ring frame 8 to which the adhesive tape 11 for dicing is joined is manufactured (step S11).

Subsequently, the ring frame 8 to which the adhesive tape 11 for dicing is joined is moved upward from below the wafer W by the ring frame lifting mechanism 16. Since the ring frame 8 is disposed facing the wafer W in a posture slightly inclined relative to the wafer W, the adhesive tape 11 for dicing is joined from an end of the wafer W as the ring frame 8 moves upward. In such a manner, the wafer mounting of integrating the wafer W and the ring frame 8 is performed (step S6). The ring frame mounted on the wafer will be referred to as a mounted frame.

The ring frame (mounted frame) 8 integrated with the wafer W is transferred to the separation table 19 to separate the surface protective tape 20 on the wafer W and is suction-held. The separation tape 21 is joined to the surface protective tape 20 joined to the wafer W. By separating the separation tape 21, the surface protective tape 20 is separated (step S7). After that, the ring frames (mounted frames) 8 are housed into the ring frame collecting unit 26 one by one (step S8). The present invention is not limited to the foregoing embodiment but may be modified without departing from the gist of the present invention.

The present invention is constructed as described above, without turning wafers upside down which are housed in the cassette after the wafer back face working process, joining of the adhesive tape for dicing to the back face of the wafer and integration to the ring frame as the subsequent process can be performed by a single apparatus which does not require a wafer turning mechanism. Thus, increase in size of the apparatus can be suppressed and the limited space in the clean room can be efficiently used.

The present invention is not limited to the foregoing embodiment but can be also modified as follows.

As shown in FIG. 3, when the ring frame 9 disposed so as to face the wafer W in a slightly inclined posture is moved upward by the ring frame lifting mechanism 16, a joining roller shown by an alternate long and two short dashes line may be rotated in the direction shown by the arrow along the non-adhesion face of the adhesive tape 11 for dicing. With the configuration, when the adhesive tape 11 for dicing is pressed by the joining roller, air bubbles are positively pushed away from the adhesion faces of the wafer W and the adhesive tape 11 for dicing. Therefore, the wafer W and the adhesive tape 11 for dicing can be integrated with higher precision without leaving air bubbles therebetween.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining an adhesive tape to a back face of a semiconductor wafer after a process of working the back face of the semiconductor wafer, the apparatus comprising:
    a holding member for holding the semiconductor wafer including a first face having a pattern formed thereon and a second face of an opposite side, in a state where the first face of the semiconductor wafer is directed upward;
    a ring frame, including a first face on which the adhesive tape is joined in advance and a second face of an opposite side, disposed below the semiconductor wafer with the first face of the ring frame on which the adhesive tape is joined being directed downward such that an adhesion face of the adhesive tape faces the second face of the semiconductor wafer, the ring frame being aligned with the semiconductor wafer; and
    a ring frame lifting mechanism for holding the second face of the ring frame, and moving the ring frame upward/downward so as to join the adhesive tape joined to the ring frame to the second face of the semiconductor wafer, wherein
    the holding member is provided with a drop preventing mechanism for preventing the semiconductor wafer from dropping until the adhesive tape is joined to the semiconductor wafer held.

2. The apparatus according to claim 1, wherein the ring frame lifting mechanism is configured to align the ring frame so as to face the second face of the semiconductor wafer in an inclined posture, and moves the ring frame upward while keeping the posture to thereby gradually join the adhesive tape to the semiconductor wafer from an upper edge side of the inclined posture near the second face of the semiconductor wafer.

3. An apparatus for joining an adhesive tape to a back face of a semiconductor wafer after a process of working the back face of the semiconductor wafer, the apparatus comprising:
    a holding member for holding the semiconductor wafer, including a first face having a pattern formed thereon and a second face of an opposite side, in a state where the first face of the semiconductor wafer is directed upward;
    a ring frame, including a first face on which the adhesive tape is joined in advance and a second face of an opposite side, disposed below the semiconductor wafer with the first face of the ring frame on which the adhesive tape is joined being directed downward such that an adhesion face of the adhesive tape faces the second face of the semiconductor wafer, the ring frame being aligned with the semiconductor wafer;
    a ring frame lifting mechanism for holding the second face of the ring frame, and moving the ring frame upward/downward so as to join the adhesive tape joined to the ring frame to the second face of the semiconductor wafer; and
    a joining roller rolled so as to cross the second face of the semiconductor wafer while pressing a non-adhesion face of the adhesive tape brought close to the second face of the semiconductor wafer by the ring frame lifting mechanism, thereby joining the adhesive tape to the semiconductor wafer, wherein
    the holding member is provided with a drop preventing mechanism for preventing the semiconductor wafer from dropping until the adhesive tape is joined to the semiconductor wafer held.

4. The apparatus according to claim 3, wherein
    the ring frame lifting mechanism aligns the ring frame so as to face the second face of the semiconductor wafer in an inclined posture, and moves the ring frame upward while keeping the posture so as to bring the ring frame close to the second face of the semiconductor wafer, and
    the joining roller is configured to gradually join the adhesive tape of the semiconductor wafer from the upper edge side of the inclined posture.

* * * * *